United States Patent
Park

(10) Patent No.: US 7,936,415 B2
(45) Date of Patent: May 3, 2011

(54) LIGHT SOURCE APPARATUS AND LIQUID CRYSTAL DISPLAY HAVING THE SAME

(75) Inventor: Jun Seok Park, Gwangju (KR)

(73) Assignee: LG Innotek Co., Ltd, Seoul (KR)

( * ) Notice: Subject to any disclaimer, the term of this patent is extended or adjusted under 35 U.S.C. 154(b) by 628 days.

(21) Appl. No.: 11/996,256

(22) PCT Filed: Aug. 8, 2007

(86) PCT No.: PCT/KR2007/003806
§ 371 (c)(1),
(2), (4) Date: Jan. 18, 2008

(87) PCT Pub. No.: WO2008/023893
PCT Pub. Date: Feb. 28, 2008

(65) Prior Publication Data
US 2010/0134711 A1 Jun. 3, 2010

(30) Foreign Application Priority Data
Aug. 24, 2006 (KR) .................. 10-2006-0080215

(51) Int. Cl.
*G02F 1/1333* (2006.01)
*F21S 13/10* (2006.01)
(52) U.S. Cl. ........... 349/58; 349/57; 349/65; 362/367
(58) Field of Classification Search .................. None
See application file for complete search history.

(56) References Cited

U.S. PATENT DOCUMENTS

| | | | |
|---|---|---|---|
| 5,845,987 A * | 12/1998 | Painter | 362/206 |
| 7,324,174 B2 * | 1/2008 | Hafuka et al. | 349/61 |
| 2003/0053307 A1 * | 3/2003 | Talamo et al. | 362/153.1 |
| 2005/0265051 A1 | 12/2005 | Yamamoto et al. | |
| 2006/0092346 A1 | 5/2006 | Moon et al. | |
| 2007/0014098 A1 * | 1/2007 | Park et al. | 362/29 |
| 2007/0047261 A1 * | 3/2007 | Thompson et al. | 362/623 |
| 2007/0115671 A1 * | 5/2007 | Roberts et al. | 362/367 |
| 2007/0211205 A1 * | 9/2007 | Shibata | 349/161 |

FOREIGN PATENT DOCUMENTS

| | | |
|---|---|---|
| JP | 6-334217 A | 12/1994 |
| JP | 2005-339881 A | 12/2005 |
| JP | 2005-353498 A | 12/2005 |
| JP | 2006-128125 A | 5/2006 |
| KR | 10-2006-0046148 A | 5/2006 |
| KR | 1020060059581 A | 6/2006 |

* cited by examiner

*Primary Examiner* — Tina M Wong
(74) *Attorney, Agent, or Firm* — Birch, Stewart, Kolasch & Birch, LLP

(57) ABSTRACT

Disclosed is a light source apparatus and a liquid crystal display having the same. The light source apparatus comprises a housing comprising a receiving groove, at least one module substrate which is received in the housing and has connecting terminals mounted at both side ends of the module substrate, a light emitting diode mounted on the module substrate, and a connecting substrate connected to the connecting terminal of the module substrate.

18 Claims, 5 Drawing Sheets

[Fig. 1]
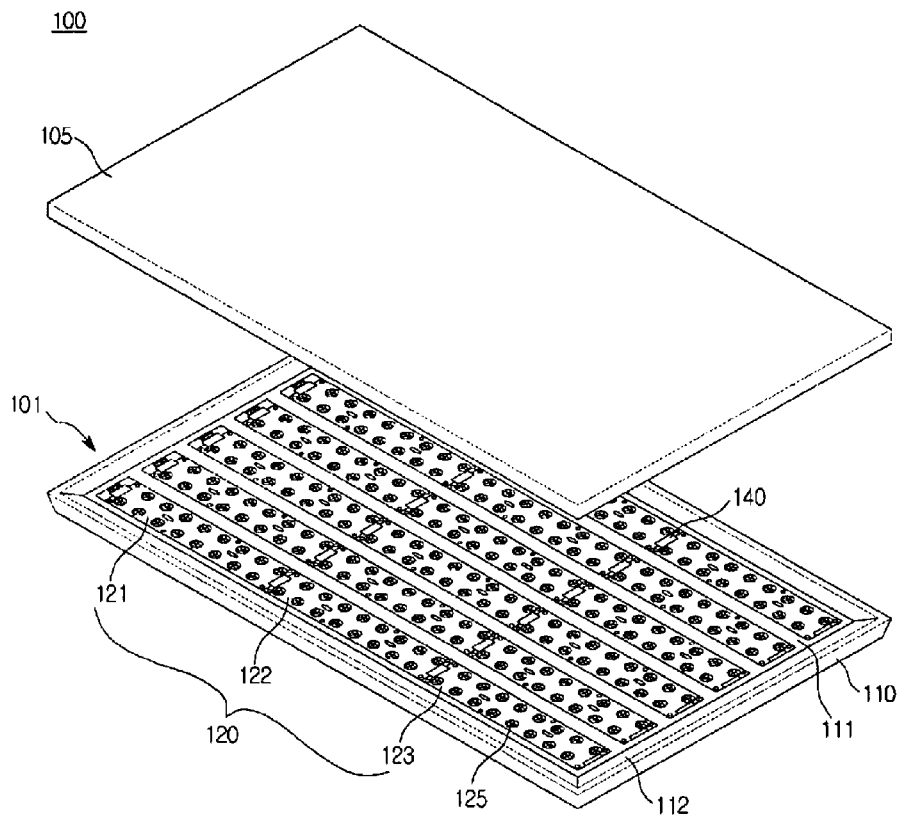
[Fig. 2]
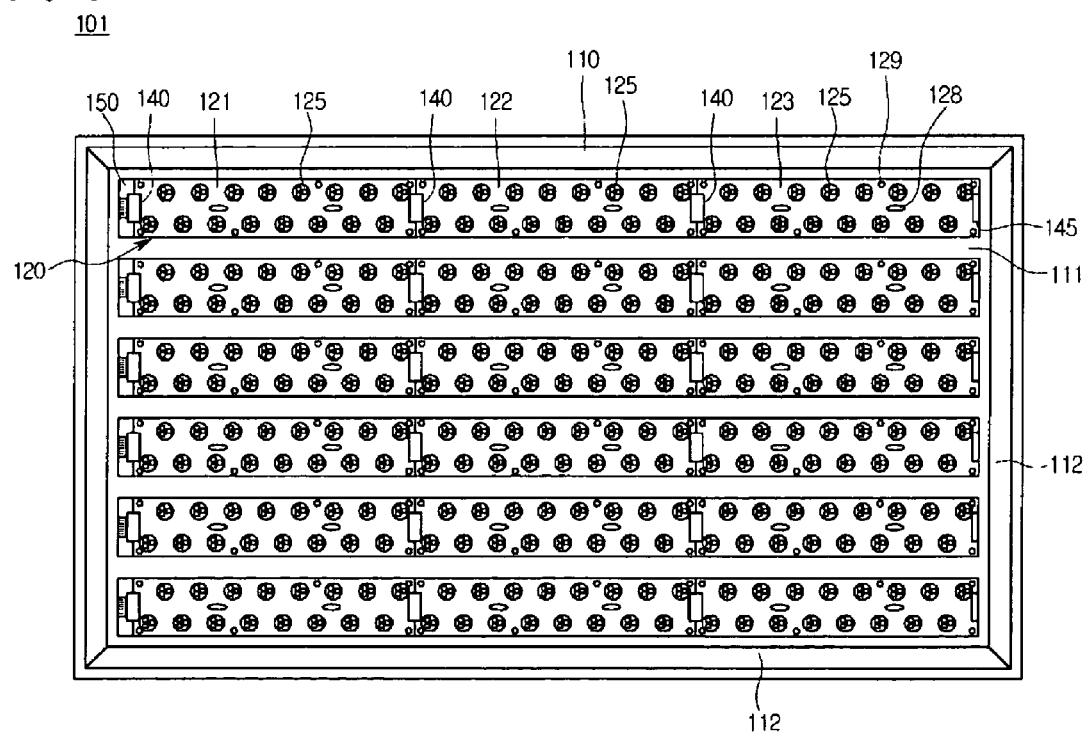

[Fig. 3]
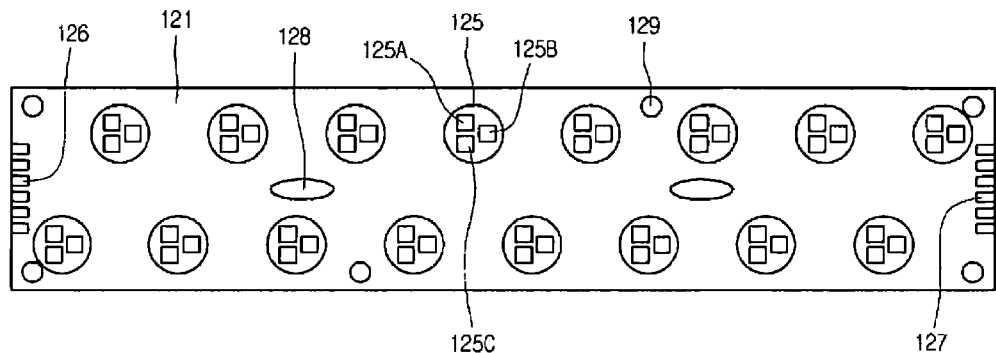
[Fig. 4]
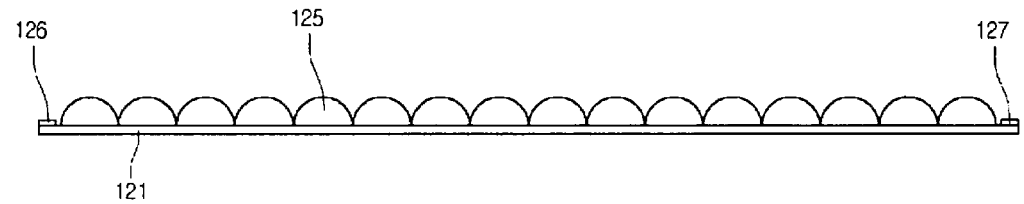
[Fig. 5]
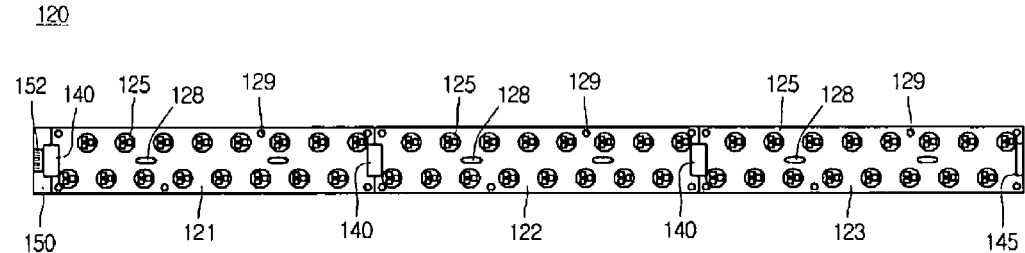
[Fig. 6]
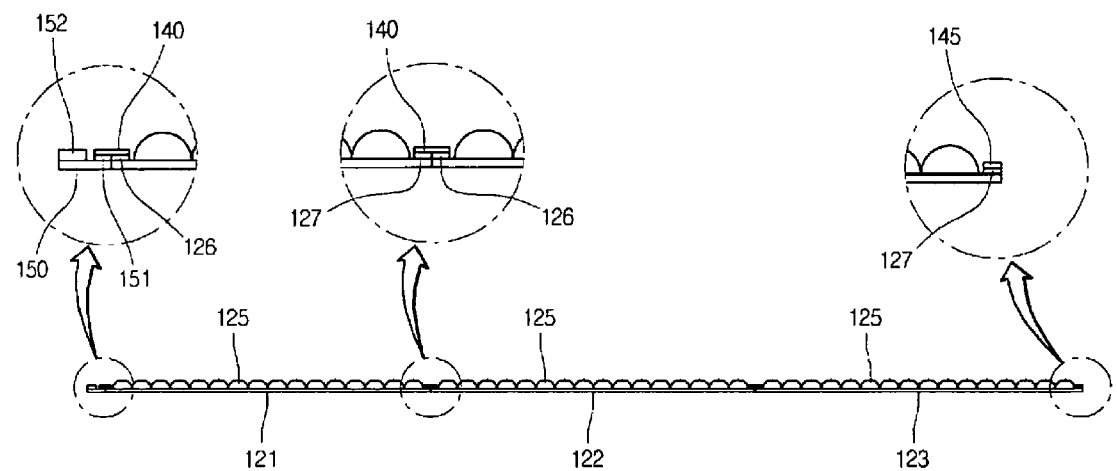

[Fig. 7]
(a)
(b)
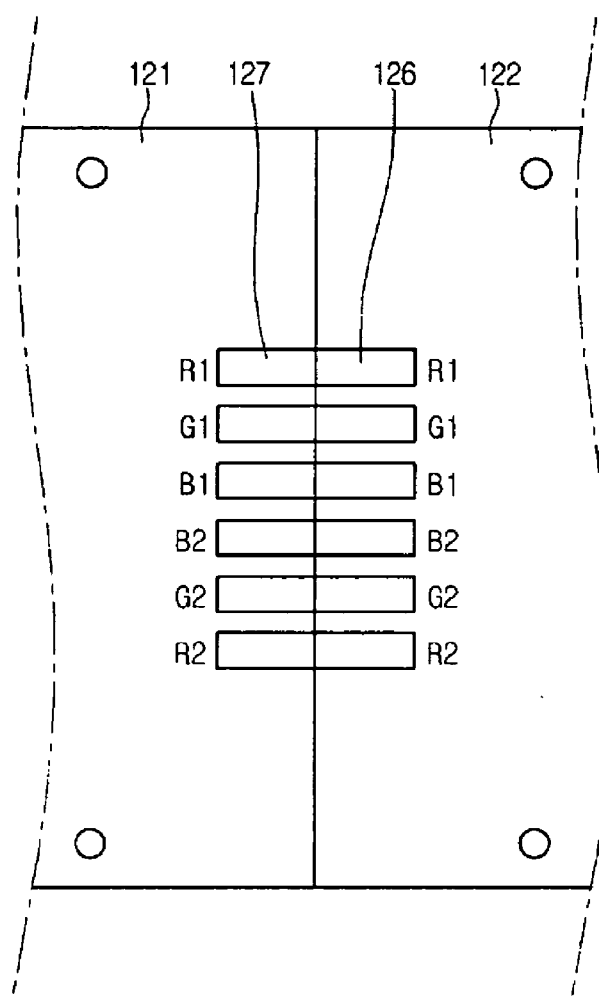
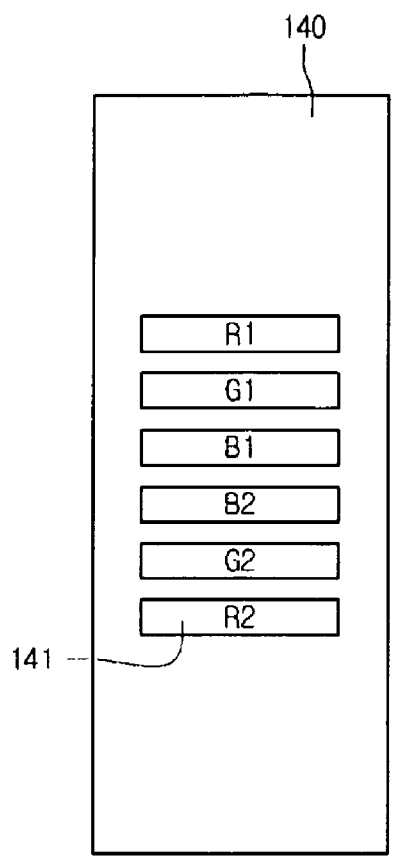

[Fig. 8]
(a) 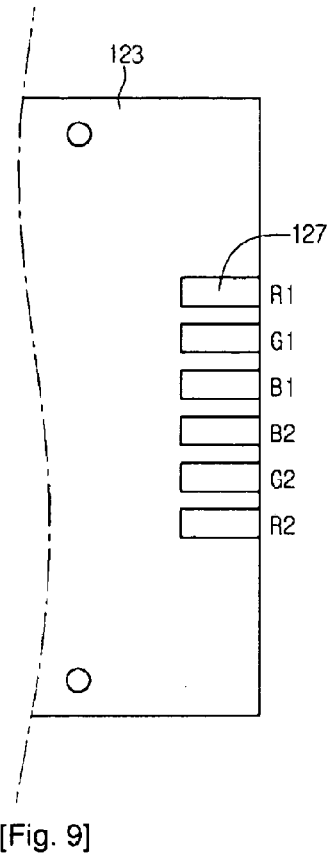
(b) 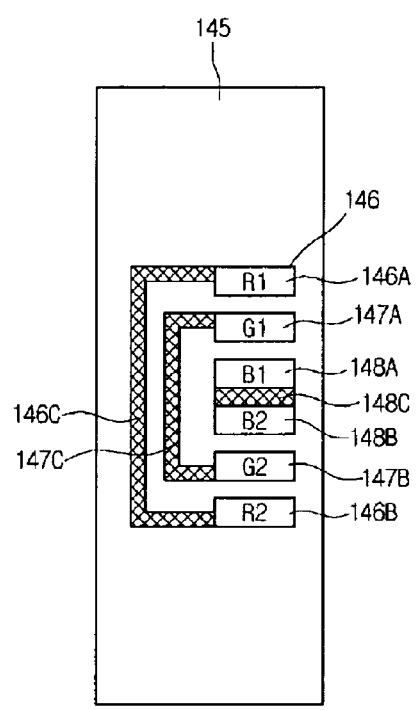
[Fig. 9]
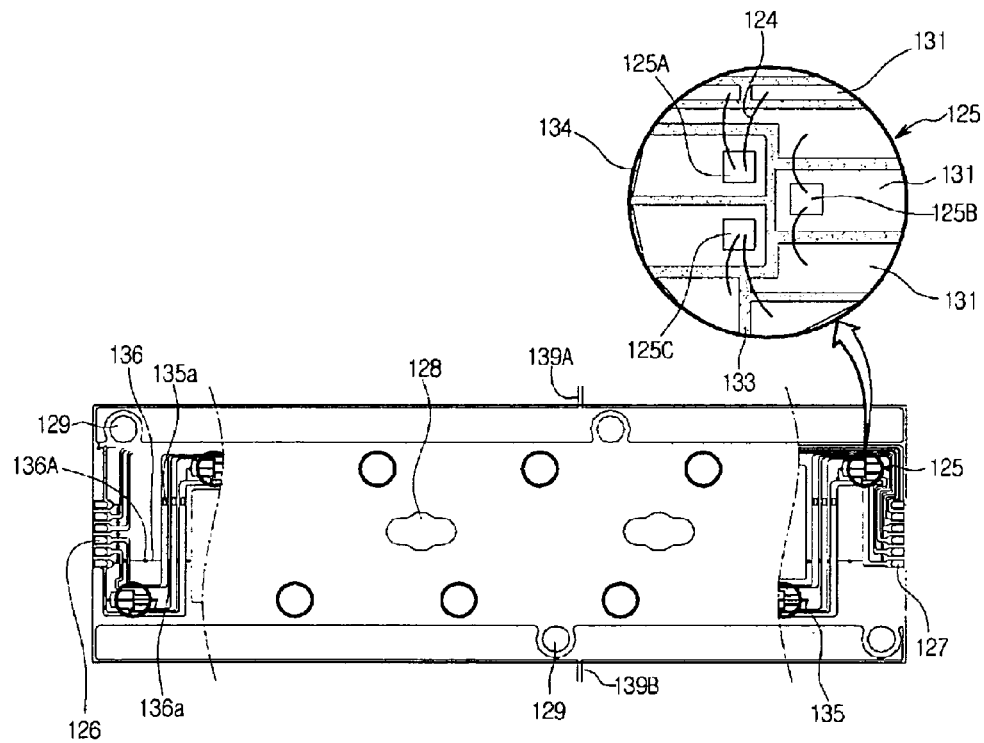

[Fig. 10]
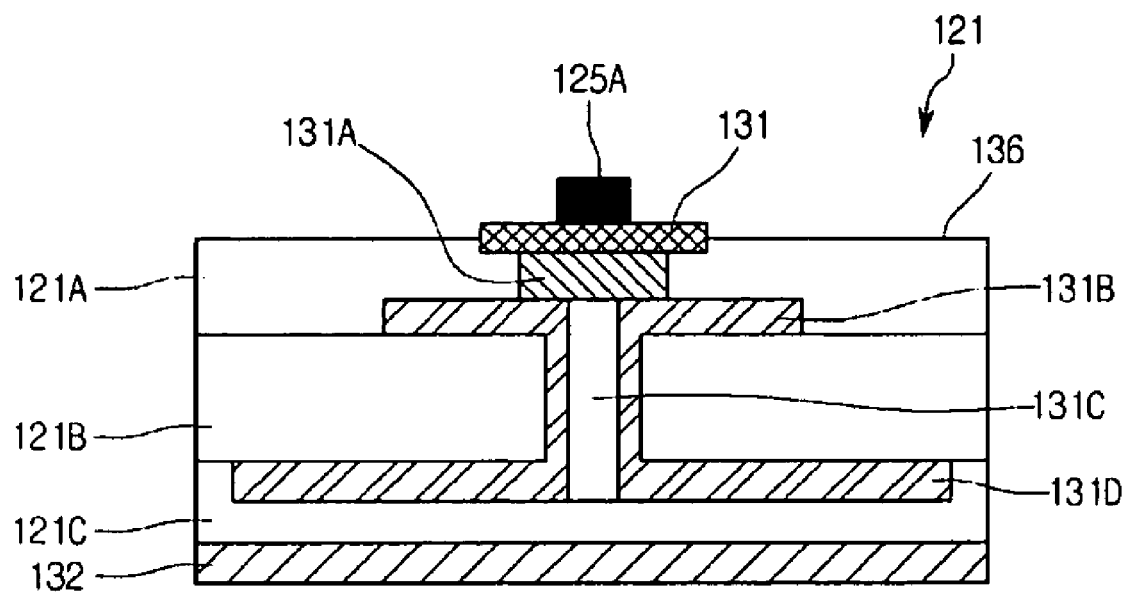

LIGHT SOURCE APPARATUS AND LIQUID CRYSTAL DISPLAY HAVING THE SAME

TECHNICAL FIELD

The embodiment relates to a light source apparatus and a liquid crystal display having the same.

BACKGROUND ART

Display apparatuses include Cathode Ray Tube (CRT), a Liquid Crystal Display (LCD) using an electro-optic effect, a Plasma Display Panel (PDP) using a gas-discharge and an Electro Luminescence Display (ELD) using electro-luminescence effect. Among the display apparatuses, the study on the LCD has been actively performed.

The LCD is a light receiving device that displays an image by controlling the amount of light from the outside, so that the LCD requires additional external light source, such as a backlight unit.

The backlight unit employs a Light Emitting Diode (LED) or a light emitting lamp, such as a Cold Cathode Florescent Lamp (CCFL).

DISCLOSURE OF INVENTION

Technical Problem

The embodiment provides a light source apparatus and a liquid crystal display having the same, in which a mechanical connection structure and an electrical connection structure of a module substrate for the LED are improved.

The embodiment provides a light source apparatus, allowing a connecting substrate to be provided at both end portions of a module substrate of the LED.

Technical Solution

An embodiment provides a light source apparatus, comprising: at least one module substrate comprising connecting terminals at both side ends thereof, a light emitting diode on the module substrate, and a plurality of connecting substrates connected to the connecting terminals of the module substrate.

An embodiment provides a light source apparatus, comprising: a housing comprising a receiving groove, at least one module substrate which is received in the housing and has connecting terminals mounted at both side ends of the module substrate, a light emitting diode on the module substrate; and a connecting substrate connected to the connecting terminal of the module substrate.

An embodiment provides a liquid crystal display, comprising: a liquid crystal panel, and a light unit disposed below the liquid crystal panel, wherein the light unit comprises a housing comprising a receiving groove, at least one module substrate which is received in the housing and has a first connecting terminal and a second connecting terminal at both end portions of the module substrate, a light emitting diode on the module substrate, and a connecting substrate which is connected to the first connecting terminal of a first end of the module substrate or the second connecting terminal of a second end of the module substrate.

Advantageous Effects

According to the embodiment, the module substrates for the LED are connected through the connecting scheme, so that an additional module substrate for the LED is not necessary.

In addition, the connecting substrates are employed on the connection portion of the module substrates for the LED, so that electrical reliability is enhanced and the mechanical strength is enhanced between the module substrates for the LED.

In addition, the reflection efficiency of the LED module substrate can be improved.

Further, the heat emission efficiency of the LED module substrate is enhanced.

BRIEF DESCRIPTION OF THE DRAWINGS

FIG. 1 is an exploded perspective view representing a liquid crystal display according to the embodiment;

FIG. 2 is a plan view representing a light unit shown in FIG. 1;

FIG. 3 is a plan view representing a module substrate according to the embodiment;

FIG. 4 is a side view representing the module substrate shown in FIG. 3;

FIG. 5 is a plan view representing a Light Emitting Device (LED) bar according to the embodiment;

FIG. 6 is a side view representing the LED bar shown in FIG. 5;

FIG. 7 is a view representing an example of the connection structure between module substrates according to the embodiment;

FIG. 8 is a view representing an example of the connection structure in end portions of a termination module substrate;

FIG. 9 is a partially detailed plan view representing the module substrate according to the embodiment; and FIG. 10 is an enlarged side-sectional view representing the module substrate according to the embodiment.

BEST MODE FOR CARRYING OUT THE INVENTION

Hereinafter, the embodiment will be described with reference to accompanying drawings.

FIG. 1 is an exploded perspective view representing a liquid crystal display according to the embodiment.

Referring to the FIG. 1, the liquid crystal display 100 includes a light unit 101 and a liquid crystal panel 105.

The light unit 101 serves as a light source for an illumination apparatus or a display apparatus. Such a light unit 101, for example, is disposed below the liquid crystal panel 105 to radiate light to the liquid crystal panel 105.

The light unit 101 includes a housing a 110 and LED bar 120 including a module substrates 121, 122 and 123. Receiving groove 111 is formed in the housing 110, and at least one row of LED bar 120 is received in the receiving groove 111. Side surfaces 112 of the housing 110 have an inclination structure so as to serve as a reflecting plate.

A LED bar 120 includes A plurality of module substrate 121, 122 and 123 which are connected each other. The module substrates 121, 122 and 123 may have the same type, and two rows of light emitting diodes are mounted on the module substrates 121, 122 and 123. In the embodiment, the number of module substrates connected each other for forming the LED bar, and the number or rows of the light emitting diodes are not limited. At least one LED bar 120 or at least one module substrate provided in the light unit 101 can be used as a light source apparatus, respectively.

The liquid crystal panel 105 displays an image corresponding to an input image signal by using the light source provided from the light unit 101. Such a liquid crystal panel 105, for example, includes a Thin Film Transistor (TFT) substrate on which thin film transistors are prepared in the form of matrix, a color filter substrate coupled to the TFT substrate while facing the TFT substrate, a liquid crystal layer which controls the light transmittance according to an electric field formed between the TFT substrate and the color filter substrate, and a spacer which maintains a distance between the TFT substrate and the color filter substrate. In addition, polarizing plates can be provided at both side ends of the liquid crystal panel. The embodiment does not limit the type and material for the liquid crystal panel.

In addition, optical sheets (not shown) can be provided between the liquid crystal panel 105 and the module substrates 121, 122 and 123 in the light unit 101. The optical sheets may include a prism sheet, a diffusion sheet, etc. In addition, a reflecting sheet may be provided in the housing 110.

FIG. 2 is a plan view representing the light unit according to the embodiment.

Referring to the FIG. 2, the LED bar 120 includes a plurality of module substrates 121, 122 and 123 and connecting substrates 140, 145 and 150.

The module substrates 121, 122 and 123 include a light emitting diode 125, connecting terminals 126 and 127 (see, FIG. 3), a guide hole 128 and a screw-coupling hole 129, respectively. The module substrates 121, 122 and 123 can be prepared as a single-layer substrate or a multi-layer substrate by using a resin-based material, such as FR-4 based resin or Composite Epoxy Materials Grade 3 (CEM-3), or a ceramic-based material. In addition, the module substrates 121, 122 and 123 can be prepared in the form of a flexible substrate.

The connecting substrate 140, 145 and 150 include an intermediate connecting substrate 140, a termination connecting substrate 145 and an external connecting substrate 150, and the intermediated connecting substrate 140 is used to connect the module substrates 121, 122 and 123 with each other, or to connect module substrates 121, 122 and 123 with the external connecting substrate 150. The termination connecting substrate 145 is mounted on the end portion of a third module substrate 123, so that the end portion of the third module substrate 123 is provided as a closed loop. The external connecting substrate 150 is connected to a first module substrate 121 through the intermediated connecting substrate 140, so that the external connecting substrate 150 is connected to an external LED driver (not shown).

The module substrates 121, 122 and 123 are electrically connected to each other by means of three connecting substrates 140, 145 and 150, so that one LED bar 120 is formed.

A guide pin (not shown) is inserted into the guide hole 128, thereby maintaining a distance between the module substrates 121, 122 and 123 and other objects (not shown), for example, optical sheets. The guide hole 128 may be prepared in various forms, such as a circle and an oval, without limitation.

The module substrates 121, 122 and 123 are fixed by means of a screw (not shown) which passes through the screw-coupling hole 129 to be coupled to the housing 110 or other elements, for example, a heat sink. The coupling device, such as a screw, can be changed and a boding device, other than the coupling device, can be employed.

FIG. 3 is a plan view representing the module substrate according to the embodiment, and FIG. 4 is a side view representing the module substrate shown in FIG. 3.

Referring to FIGS. 3 and 4, the light emitting diodes 125 mounted on the module substrate 121 can be prepared as at least one LED chip. For instance, the light emitting diode 125 can be provided as a package including a red LED chip 125A, a green LED chip 125B and a blue chip 125C, or a package including at least one blue LED chip and a fluorescent material. The number and the type of the LED chip or the type of the package is not limited.

A first connecting terminal 126 and a second connecting terminal 127 are formed at both end portions of the module substrate 121. The number of pins on the first connecting terminals 126 is identical to that of the second connecting terminals 127. The function of the pins varies according to the LED chips 125A, 125B and 125C. The first and second connecting terminals 126 and 127 can be changed depending on the number or type of the LED chips 125A, 125B and 125C.

FIG. 5 is a plan view representing the LED bar according to the embodiment, and FIG. 6 is a side view representing the LED bar shown in FIG. 5.

Referring to FIGS. 5 and 6, the external connecting substrate 150, and the first to third module substrates 121, 122 and 123 are connected in series in the LED bar 120.

The external connecting substrate 150 is connected with the first module substrate 121 by the intermediate substrate 140. The intermediate substrate 140 connects a fifth connecting terminal 151 of the external connecting substrate 150 with a first connecting terminal 126 of the first module substrate 121. The external connecting substrate 150 is connected with the LED driver through an external connector.

The first and second module substrates 121 and 122 are connected to each other by the intermediate connecting substrate 140, and the second and third module substrates 122 and 123 are connected to each other by the intermediate connecting substrate 140. The intermediate connecting substrate 140 connects a second connecting terminal 127 of the first module substrate 121 with the first connecting terminal 126 of the second module substrate 122, and connects the second connecting terminal 127 of the second module substrate 122 with the first connecting terminal 126 of the third module substrate 123.

The third module substrate 123 serves as an end portion of the LED bar, and is connected to the termination connecting substrate 145. The termination connecting substrate 145 is connected to the second connecting terminal 127 of the third module substrate 123, allowing the end portion of the third module substrate 123 to form a closed loop.

The first and second connecting terminals 126 and 127 according to the embodiment are disposed on the first to third module substrates 121, 122 and 123. However, the first and second connecting terminals 126 and 127 can be disposed under the first to third module substrates 121, 122 and 123. In this case, the intermediate connecting substrate 140 and the termination connecting substrate 145 can be disposed under the module substrates 121, 122 and 123.

As described above, the first to third module substrates 121, 122 and 123 are connected to each other in series by means of the connecting substrates 140, 145 and 150, so that the strength between the first to third module substrates 121, 122 and 123 is enhanced. In this case, at least one of the connecting substrates 140, 145 and 150 is provided as a flexible substrate.

Connecting substrates 140, 145 and 150 can be mounted on the first to third module substrates 121, 122 and 123 by a surface mounting technology (SMT). That is, the first to third module substrates 121, 122 and 123 and the external connecting substrate 150 are disposed in series, and a cream solder is coated on the connecting terminals 126, 127 and 151. Then, the intermediate connecting substrate 140 and the termination connecting substrate 145 are disposed on the connecting terminals 126, 127 and 151, and then a reflow soldering process is performed. Accordingly, the first to third module substrates 121, 122 and 123 are electrically connected with the connecting substrates 140, 145 and 150.

FIG. 7(A) is a view representing two module substrates coupled to each other, and FIG. 7(B) is a rear view representing the intermediate connecting substrate.

Referring to FIGS. 7(A) and (B), the second connecting terminal 127 of the first module substrate 121 corresponds to the first connecting terminal 126 of the second module substrate 122, and the third connecting terminal 141 matches with the first and second connecting terminals 126 and 127 that correspond to each other. In this case, the third connecting terminal 141 is bonded to the first and second connecting terminals 126 and 127 by the SMT. Accordingly, R1 pads and R2 pads, G1 pads and G2 pads, and B1 pads and B2 pads of the connecting terminals 126 and 127 are connected with R1 pads and R2 pads, G1 pads and G2 pads, and B1 pads and B2 pads of the connecting terminal 141, respectively.

FIG. 8(A) is a view representing the second connecting terminal of the third module substrate, and FIG. 8(B) is a rear view representing the termination connecting substrate.

Referring to FIG. 8, the second connecting terminal 127 of the third module substrate 123 corresponds to a fourth connecting terminal 146 of the termination connecting substrate 145.

In a fourth connecting terminal 146 of the termination connecting substrate 145, the R1 pad 146A is connected to the R2 pad 146B by a first closed circuit pattern 146C, the G1 pad 147A is connected to the G2 pad 147B by a second closed circuit pattern 147C, and the B1 pad 148A is connected to the B2 pad 148B by a third closed circuit pattern 148C. The fourth connecting terminal 146 of the termination connecting substrate 145 having the first to third closed circuit patterns 146C, 147C and 148C is connected with the second connecting terminal 127 of the third module substrate 123, so that the second connecting terminal 127 of the third module substrate 123 forms the closed loop. That is, the closed circuit pattern 146C, 147C and 148C allow the pads R1 and R2, G1 and G2, and B1 and B2 of the same LED chip to be connected in series, so that the end portion of the LED bar forms the closed loop circuit.

As described above, the end portion of the module substrate 123 forms the closed loop by using the termination connecting substrate 145 having the closed loop pattern, so that the module substrate having the closed circuit pattern at the end portion does not need to be separately manufactured.

FIG. 9 is partially detailed view representing a circuit pattern of the module substrate according to the embodiment.

Referring to FIG. 9, a predetermined circuit pattern 135 is formed on the module substrate 121, and a plurality of lead electrodes 131 are formed on a region where the LED chips 125A, 125B and 125C are mounted. Such circuit pattern 135 and the lead electrode 131 are connected by a plating line 136, thereby forming the closed circuit of the plating line.

In addition, a plating layer is formed through an electro-plating process by providing power to plating power lines 139A and 139B. That is, a silver plating layer or a gold plating layer is formed on the circuit pattern 135 and the lead electrode 131 by the electro-plating process. The process of forming the plating layer is not limited to the electro-plating process.

In addition, at least one drilling point 136A is formed on the plating line 136. The drilling point 136A is to open the closed circuit of the plating line 136 in the drilling process. The drilling point 136A of the plating line 136 is prepared in the form of a hole by the drilling process to dissipate heat generated from the module substrate 121.

In addition, a test pad terminal 135A for testing the LED chips 125A, 125B and 125C is formed on the circuit pattern 135 of the module substrate 121. The test for each LED chip is performed through the test pad terminal 135A.

In addition, the silver plating layer is formed on the lead electrode 131 in the light emitting diode 125, and white ink is coated on the module substrate 121, except for the lead electrode 131 to improve the reflection efficiency. That is, white ink is coated on the module substrate 121, except for the lead electrode 131 of the light emitting diode 125, so that the light generated from the LED chips 125A, 125B and 125C is reflected, thereby improving the reflection efficiency. In addition, a barrier 134 may be formed at an outer line of the light emitting diode 125, and the barrier 134 maintains a molding configuration when a molding process is performed using a molding material, and prevents the molding material from overflowing to exterior.

Although the LED chips 125A, 125B and 125C have been described in that they have a structure bonded by a wire 124, other bonding scheme (such as a flip chip scheme) can be employed according to the structure of the semiconductor structure. The embodiment does not limit the bonding structure for the LED chips. In addition, a protection device for protecting the LED chips can be mounted on the LED chips.

FIG. 10 is a sectional view representing the module substrate 121 according to the embodiment.

Referring to 10, the module substrate 121 includes multi-layer substrates 121A, 121B and 121C, in which multi-copper layers 131A, 131B and 131D are provided below the lead electrode 131. The LED chip 125A is mounted on the lead electrode 131, and a first copper layer 131A primary conducts the heat generated from the LED chip 125A, and a second copper layer 131B and a third copper layer 131D emit the heat conducted from the first copper layer 131A through a via hole 131C and the third copper layer 131 D. In the module substrate 121, the heat emission characteristic of the light emitting device can be improved by the multi-copper layers.

In addition, the silver plating layer 132 is formed at a lower surface of the module substrate 121 as a bottom surface. The silver plating layer 132 reduces the heat resistance in the bottom layer of the module substrate 121, and improves the heat conductivity.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

INDUSTRIAL APPLICABILITY

According to the embodiment, the module substrates for the LED are connected through the connecting scheme, so that an additional module substrate for the LED is not necessary.

In addition, the connecting substrates are employed on the connection portion of the module substrates for the LED, so that electrical reliability is enhanced and the mechanical strength is enhanced between the module substrates for the LED.

In addition, the reflection efficiency of the LED module substrate can be improved.

Further, the heat emission efficiency of the LED module substrate is enhanced.

In addition, the light unit including the LED module substrate can be provided in the form of the LED bar by using the connecting substrates.

The invention claimed is:

1. A light source apparatus comprising:
   at least one module substrate comprising connecting terminals at both side ends thereof;
   a light emitting diode on the module substrate; and
   a plurality of connecting substrates connected to the connecting terminals of the module substrate,
   wherein the connecting substrate comprises a termination connecting substrate, by which the connecting terminal provided at one end of a final module substrate of the module substrates is prepared as a closed loop circuit.

2. The light source apparatus as claimed in claim 1, wherein the connecting substrate comprises an intermediate connecting substrate connecting the connecting terminals of adjacent module substrates to each other.

3. The light source apparatus as claimed in claim 1, wherein the connecting substrate comprises an external connecting substrate which is disposed at a first end of a first module substrate of the module substrates, and an intermediate connecting substrate which connects the connecting terminal of the first module substrate with the external connecting substrate and/or between the connecting terminal of the module substrates.

4. The light source apparatus as claimed in claim 3, wherein the connecting substrate comprises a connecting terminal, which corresponds to at least one of connecting terminals provided at both side ends of the module substrate.

5. The light source apparatus as claimed in claim 3, wherein the external connecting substrate comprises an external connector to which a light emitting diode driver is connected.

6. The light source apparatus as claimed in claim 4, wherein the connecting terminal is formed on the module substrate or under the module substrate, and the intermediate connecting substrate is mounted on the external connecting substrate and on the connecting terminals between plural module substrates.

7. The light source apparatus as claimed in claim 1, wherein the light emitting diode comprises at least one LED chip having at least one color.

8. The light source apparatus as claimed in claim 1, wherein the module substrate comprises a single-layer printed circuit board or a multi-layer printed circuit board.

9. The light source apparatus as claimed in claim 1, wherein the module substrate comprises a multi-copper layer and a via hole formed in the module substrate, and a silver plating layer formed on a bottom surface of the module substrate.

10. The light source apparatus as claimed in claim 7, wherein the module substrate includes a test pad terminal for testing the LED chip.

11. The light source apparatus as claimed in claim 1, wherein the module substrate comprises white ink coated on the module substrate, except for a region where the LED chip is mounted.

12. A light source apparatus comprising:
    a housing comprising a receiving groove;
    at least one module substrate which is received in the housing and has connecting terminals mounted at both side ends of the module substrate;
    a light emitting diode on the module substrate; and
    a connecting substrate connected to the connecting terminal of the module substrate,
    wherein the connecting substrate comprises a termination connecting substrate, which allows a connecting terminal provided at one end of a final module substrate of the module substrates to be feedback in a form of a closed loop.

13. The light source apparatus as claimed in claim 12, wherein the connecting substrate comprises an external connecting substrate, which is provided at one end of a first module substrate of the module substrates to supply a driving power.

14. The light source apparatus as claimed in claim 13, wherein the connecting substrate comprises a plurality of intermediate connecting substrates which connect both connecting terminals of a plurality of module substrates and/or between the external connecting substrate and the first connecting terminal of the first module substrate.

15. The light source apparatus as claimed in claim 12, comprising at least one LED bar, on which the module substrates are connected to each other in series by the connecting substrate.

16. A liquid crystal display comprising:
    a liquid crystal panel; and
    a light unit disposed below the liquid crystal panel,
    wherein the light unit comprises a housing comprising a receiving groove, at least one module substrate which is received in the housing and has a first connecting terminal and a second connecting terminal at both end portions of the module substrate, a light emitting diode on the module substrate, and a connecting substrate which is connected to the first connecting terminal of a first end of the module substrate or the second connecting terminal of a second end of the module substrate,
    wherein the connecting substrate comprises a termination connecting substrate which comprises a closed loop pattern for forming a second connecting terminal of a second end of a final module substrate as a closed loop circuit.

17. The liquid crystal display as claimed in claim 16, wherein the connecting substrate comprises:
    an external connecting substrate for external connection; and
    at least one intermediate connecting substrate comprising a third connecting terminal which connects the external connecting substrate with the first connecting terminal of the first module substrate and/or between the connecting terminals of module substrates.

18. The liquid crystal display as claimed in claim 17, wherein one of the module substrate, the external connecting substrate, the intermediate substrate and the termination substrate comprises a flexible substrate.

* * * * *